United States Patent [19]

Chiou et al.

[11] Patent Number: 5,553,566
[45] Date of Patent: Sep. 10, 1996

[54] METHOD OF ELIMINATING DISLOCATIONS AND LOWERING LATTICE STRAIN FOR HIGHLY DOPED N+ SUBSTRATES

[75] Inventors: Hering-Der Chiou, Tempe; Geoffrey J. Crabtree, Chandler, both of Ariz.

[73] Assignee: Motorola Inc., Schaumburg, Ill.

[21] Appl. No.: 493,607

[22] Filed: Jun. 22, 1995

[51] Int. Cl.$^6$ .................................................. C30B 15/04
[52] U.S. Cl. .................................. 117/2; 117/20; 117/31; 117/932
[58] Field of Search ........................... 117/1, 2, 13, 200, 117/30, 31, 214, 912, 932; 437/134

[56] References Cited

U.S. PATENT DOCUMENTS

| | | | |
|---|---|---|---|
| 4,200,621 | 4/1980 | Liaw et al. | 117/21 |
| 4,769,689 | 9/1988 | Lin | 257/607 |
| 5,242,531 | 9/1993 | Klingshirn et al. | 117/21 |

OTHER PUBLICATIONS

W. Edel et al., "Stress Relief by Counterdoping," IBM Technical Disclosure Bulletin, vol. 13, No. 3, Aug. 1970, p. 632.

S. Matsumoto et al., "Effects of Diffusion–induced Strain and Dislocation on Phosphorus Diffusion into Silicon," J. Electrochem. Soc: Solid–State Science and Technology, vol. 125, No. 11, Nov. 1978, pp. 1840–1845.

S. Aronowitz et al., "P–type Dopant Diffusion Control in Silicon Using Germanium," J. Electrochem. Soc., vol. 138, No. 6, Jun. 1991, pp. 1802–1806.

Primary Examiner—Felisa C. Garrett
Attorney, Agent, or Firm—Bruce T. Neel

[57] ABSTRACT

A method for fabricating semiconductor substrates with resistivity below 0.02 ohm-cm is provided. This low resistivity is achieved by doping a silicon melt with a phosphorus concentrations above $1 \times 10^{18}$. The silicon melt is also doped with a germanium concentration that is 1.5 to 2.5 times that of the phosphorus concentration and a stress and dislocation free crystalline boule is grown. Phosphorus in high concentrations will induce stress in the crystal lattice due to the difference in the atomic radius of silicon atoms versus phosphorus atoms. Germanium compensates for the atomic radius mismatch and also retards the diffusion of the phosphorus as the diffusion coefficient remains relatively constant with a doping of $1 \times 10^{18}$ to $1 \times 10^{21}$ atoms per cm$^3$. This will retard phosphorus from diffusing into an overlying epitaxial layer and retard other layers formed on the substrate from being auto-doped.

6 Claims, 2 Drawing Sheets

METHOD OF ELIMINATING DISLOCATIONS AND LOWERING LATTICE STRAIN FOR HIGHLY DOPED N+ SUBSTRATES

BACKGROUND OF THE INVENTION

This invention relates, in general, to doping silicon substrates and more particularly, to compensating for the affects high concentrations of dopant have on substrates.

It is well known in the art that the performance of a semiconductor device can be improved by employing epitaxial films formed on substrates with low resistivity. The resistivity of a substrate crystal can be reduced by doping the substrate with donor or acceptor atoms which will make the substrate either n type conductivity or p type conductivity. Typical dopant atoms used, however, do not have the same atomic radius as the substrate crystal atoms. Silicon atoms have an atomic radius of 1.18 Å and common dopant atoms such as phosphorus and boron have an atomic radius of 1.08 Å and 0.86 Å respectively.

The size mismatch between the dopant atoms and the silicon substrate atoms will induce strain in the crystal. This strain is a result of the substrate lattice contracting as the lattice is forced to compensate for the high concentration of smaller dopant atoms. As the concentration of these dopant atoms increases, the lattice will continue to contract which will further reduce the lattice constant. Current commercial processes do not distribute the dopant uniformly. The radial and axial non-uniform dopant distribution will generate internal stress. This stress will be replicated and amplified by an overlying epitaxial layer and as the thickness of the epitaxial layer increases so too will the strain in the layer.

A second difficulty with forming epitaxial layers on a substrate arises from misfit dislocations at the substrate interface. In growing a lightly doped phosphorus n– epitaxial layer on top of a heavily doped phosphorus n+ substrate, the lattice parameter of the n– layer is larger than the lattice parameter of the n+ substrate. Therefore, a layer of misfit dislocations is generated between the n– and n+ layers. These dislocations will hinder the performance of a semiconductor device as the dislocations contribute to junction leakage A high dopant concentration will also pose problems due to the presence of a diffusion gradient. The high concentration of dopant in the substrate will naturally want to diffuse to areas of lower concentration such as to the overlying epitaxial layer with a lower dopant concentration This is likely to drive dopant atoms into the epitaxial layer or auto-dope subsequent layers formed over the substrate.

Accordingly, in order to form n type substrates with resistivities below 0.01 ohm-cm it is necessary to dope a substrate with phosphorus concentrations above $4.5 \times 10^{18}$ atoms per $cm^3$. A method is necessary to compensate for the lattice strain created by dopant atoms and retard dopant atoms from diffusing into layers overlying the substrate.

DETAILED DESCRIPTION OF THE DRAWINGS

Previously known methods for reducing the sheet resistivity of silicon substrates have relied on doping the substrate with a n type or p type dopant. Unfortunately this approach is not without its limitations. Most dopants used in silicon semiconductor processing have an atomic radius that is different than the atomic radius of silicon. As a result, as phosphorus or boron is added, the silicon crystal contracts since the dopant atoms are smaller than the host silicon atoms. This contraction will induce strain in the lattice.

Stress is also created when an epitaxial layer is deposited on a substrate that has a different lattice parameter. Such is the case when an epitaxial layer is deposited on a heavily phosphorus doped n+ substrate. As a result of the mismatch in lattice parameters, dislocations will be created along the interface of the substrate and overlying epitaxial layer. These mismatch dislocations will hinder the performance of a semiconductor device formed in the epitaxial layer as they will increase junction leakage of the device.

This stress will increase as the thickness of the epitaxial layer is increased. Stress will warp the substrate which hampers the photolithography steps common to silicon processing. Highly doped substrates also have a tendency to diffuse dopant into the epitaxial layer or auto-dope overlying layers during subsequent processing.

One previously known method for correcting lattice mismatch strain between heavily boron doped p+ substrates and lightly doped epitaxial layers was taught by Lin in U.S. Pat. No. 4,769,689 which was issued on Sep. 6, 1988. In this particular application, germanium was added to the substrate in a concentration equal to approximately 8 times the concentration of boron which was used to dope the substrate. This method only applies to boron doped substrates with concentrations higher than 0.002 percent atomic weight and does not address issues associated with diffusion of boron dopant into the epitaxial layer overlying the substrate. This previously known method for doping a substrate with boron and germanium only reduces the substrate resistivity from 0.01 ohm-cm to 0.002 ohm-cm.

The use of germanium to compensate silicon substrates that are heavily doped with boron does have limitations. As reported by Aronowitz et al. in "P-type Dopant Diffusion Control in Silicon Using Germanium" which was published in the June 1991 issue of the Journal of the Electrochemical Society, the presence of germanium will enhance and accelerate the diffusion of boron atoms which are on substitutional lattice sites in the silicon crystal. Thus in order to fabricate substrates with low resistivities via high concentrations of boron, germanium cannot be used to compensate the lattice. The accelerated rate of diffusion will cause the boron to auto-dope more into the overlying epitaxial layer or subsequent layers formed on the substrate.

Figure 1:
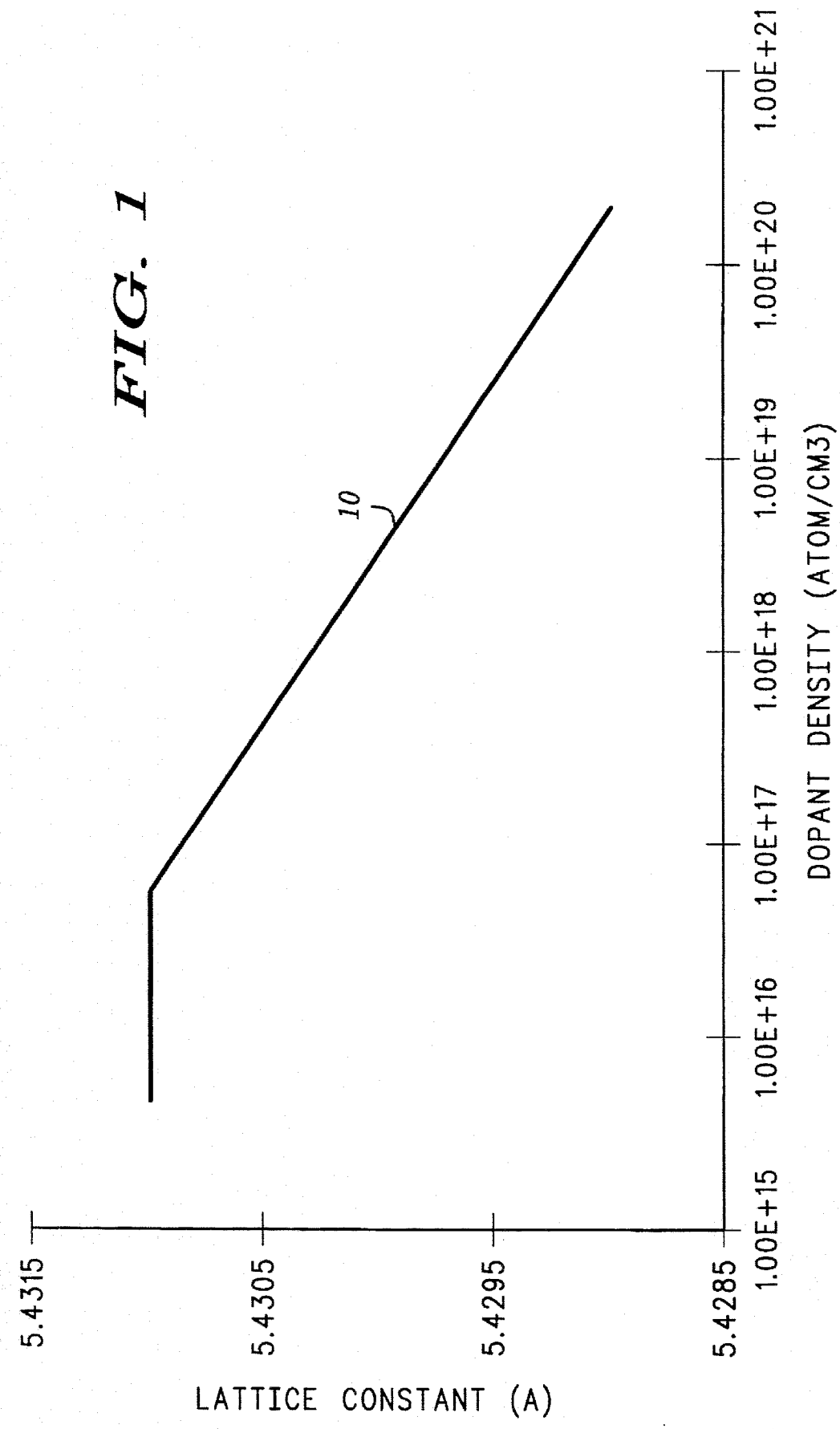
FIG. 1 is a graph showing the lattice constant as a function of phosphorus dopant concentration.

In the present invention, a method is provided for achieving substrate resistivities that are two orders of magnitude lower than taught by Lin. The present invention also provides benefits not provided in the patent by Lin such as eliminating the dislocations between a heavily doped n+ substrate and a lightly doped n– epitaxial layer and retarding the phosphorus diffusion rate. A highly doped n+ substrate is fabricated using a first dopant such as phosphorus with concentrations of $1 \times 10^{18}$ to $1.1 \times 10^{20}$ atoms per $cm^3$ to reduce substrate resistivity below 0.02 ohm-cm. With such a high concentration of atoms that have an atomic radius smaller than the crystal host atom, the lattice will contract. FIG. 1 quantifies the amount of lattice contraction as a function of phosphorus doping (shown as line 10). The y-axis shows the lattice constant of the crystal in Å versus the x-axis which is the concentration of dopant atoms in terms of the number of phosphorus atoms per cubic centimeter.

To compensate for lattice contraction due to high concentration of dopant atoms, a second dopant of germanium is added to the lattice. Germanium has an atomic radius of 1.28 Å which will compensate for the smaller phosphorus atoms. One atomic percent of germanium in silicon will cause the lattice to expand 0.0022 Å. For example, to fabricate a n type semiconductor substrate with a resistivity of 0.001 ohm-cm, phosphorus is added to the substrate with a concentration of $7.38 \times 10^{19}$ atoms per $cm^3$ which is 0.148 atomic percent. This concentration of phosphorus will cause the lattice to contract 0.00157 Å and require a germanium concentration of 0.71 atomic percent to compensate for lattice strain. This concentration of germanium is 4.8 times that of the phosphorus. Experimental and theoretical calculations suggest that the preferred germanium concentration is approximately 1.5 to 2.5 times that of the phosphorus concentration.

A method will now be provided to fabricate the above mentioned embodiment of the present invention. A substrate is fabricated using the traditional Czochralski technique to pull a dislocation free single crystal silicon boule from a molten mixture. Such a technique was described in U.S. Pat. No. 4,200,621 which was issued to Liaw et al. on Apr. 29, 1980 and is hereby incorporated herein by reference. The present embodiment is not limited to the weights of the following example. A stress free crystalline boule can be formed by maintaining the proper proportions of constituents. The molten mixture is formed by placing approximately 18 Kgrams of polysilicon chunks with 95 grams of germanium chips in a quartz crucible and heated to the melting point of (1420° C.) in an argon atmosphere. Then 60 grams of phosphorus is placed in a quartz beaker with an inverted bell jar on its top. The beaker of phosphorus is placed above the molten silicon surface such that a flow of phosphorus vapor is directed at the melt and allowed to diffuse into the molten silicon. As is well known in the art, the semiconductor substrate wafers are formed from the crystalline boule by sawing the wafers with the desired thickness.

By using a germanium concentration that is 1.5 to 2.5 times the concentration of the phosphorus, several issues associated with a highly doped substrate are addressed. Since germanium has a larger atomic radius than silicon, germanium compensates for the contraction of the crystal lattice due to the presence of smaller phosphorus atoms. This renders the substrate essentially stress free and will permit an epitaxial layer of a first conductivity type such as n type or a second conductivity type such as p type to be formed overlying the substrate. An epitaxial layer of any thickness can be formed on the substrate without inducing strain or bowing of the substrate.

Figure 2:
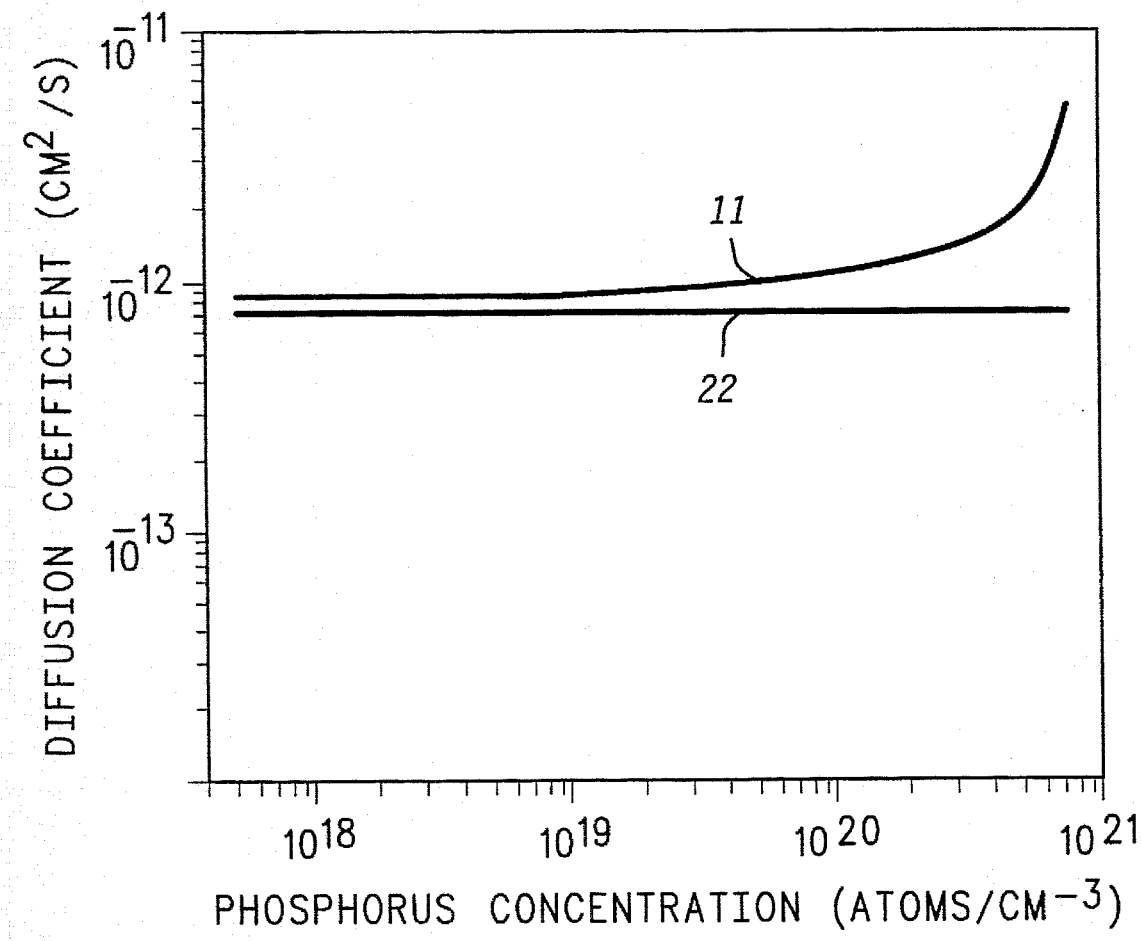
FIG. 2 is a graph demonstrating the improvement seen in the diffusion coefficient with the present invention.

The addition of germanium to the substrate mixture also addresses problems of diffusion when doping a substrate with phosphorus above $1 \times 10^{18}$ atoms per $cm^3$. Concentrations of phosphorus of this magnitude will have a high diffusion rate which will tend to diffuse dopant from the highly concentrated substrate to the lower concentration epitaxial layer. The amount of phosphorus that will diffuse from the substrate is proportional to the diffusion coefficient of the dopant atoms. FIG. 2 demonstrates the improvement gained by doping the substrate with germanium by plotting the diffusion coefficient (y-axis) as a function of the number of phosphorus atoms per cubic centimeter (x-axis). Previously without germanium, the high phosphorus concentration will diffuse with a diffusion coefficient value shown as line 11. In the present invention, the addition of germanium to the substrate impedes the phosphorus diffusion and the diffusion coefficient remains constant with increasing phosphorus concentration shown as line 22 in FIG. 2.

In a paper published by Matsumoto et al. in the November 1978 issue of Journal of Electrochemical Society entitled "Effects of Diffusion-Induced Strain and Dislocation on Phosphorus Diffusion into Silicon" a method for retarding the surface diffusion of phosphorus was presented. In their experimentation, Matsumoto et al. doped regions of an already grown silicon crystal using liquid phosphorus sources. The diffusion of phosphorus atoms out of these doped regions created dislocations on the surface of the silicon substrate. By doping the substrate from the surface with a liquid germanium source, the surface diffusion of the phosphorus was retarded. This technique does reduce the number of surface dislocations, however, dislocations will form in the silicon substrate due to the migration of the germanium atoms into the silicon lattice. In the present invention, the germanium dopant is added to the silicon lattice during the crystal growth instead of relying on surface diffusion with liquid sources. By adding the germanium to the silicon crystal during the boule growth, the present invention provides a method for forming dislocation free substrates that avoids the forming of dislocations from liquid diffusion of germanium.

An additional benefit of the present invention which was not offered by previously known methods, is improvement in junction leakage. Mismatch dislocations present in the substrate crystal or present at the interface of the substrate and epitaxial layer, increase the junction leakage of semiconductor devices. The number of dislocations in the epitaxial film can multiply and migrate from the substrate during subsequent thermal processing. The presence of germanium in the substrate will produce substrates that are relatively free of dislocations. Therefore, the addition of germanium to the substrate will reduce junction leakage.

The present invention provides an embodiment that allows for the growing of a n– epitaxial layer on a heavily doped substrate by addressing the issues associated with a substrate with phosphorus concentrations above $1 \times 10^{18}$ atoms per $cm^3$. By adding germanium in a concentration that is 1.5 to 2.5 times the concentration of phosphorus, it is possible to produce substrates that are both relatively stress and dislocation free. The germanium dopant corrects the lattice mismatch stress created by phosphorus atoms which have an atomic radius that is different than the silicon crystal substrate.

The germanium also addresses the diffusion problems associated with such high doping concentrations. By occupying substitutional lattice sites in the crystal, germanium will keep the diffusion coefficient constant up to phosphorus concentrations of $1 \times 10^{21}$. It should also be appreciated that germanium is isoelectric in a silicon crystal and will not affect the conductivity of the n type substrate.

We claim:

1. A method for fabricating a highly doped n type semiconductor substrate essentially free of dislocations and lattice strain comprising the steps of:

forming a melt from silicon chunks and a first dopant having a first concentration;

doping the melt with a second dopant having a second concentration, wherein the first dopant compensates for the lattice strain created by the second dopant and the second dopant lowers resistivity of the melt;

growing a crystalline boule from the melt; and forming substrates from the crystalline boule.

2. The method of claim 1 wherein the first dopant consists essentially of germanium.

3. The method of claim 1 wherein the second dopant consists essentially of phosphorus.

4. The method of claim 1 wherein the first concentration of the first dopant is approximately 1.5 to 2.5 times the second concentration of the second dopant.

5. The method of claim 1 wherein the second concentration of the second dopant reduces the resistivity of the highly doped n type semiconductor substrate to less than 0.02 ohm-cm.

6. The method of claim 1 wherein the step of doping the melt is accomplished by placing a quartz beaker with an inverted bell jar containing a source of the second dopant.

* * * * *

UNITED STATES PATENT AND TRADEMARK OFFICE
CERTIFICATE OF CORRECTION

PATENT NO. : 5,553,566
DATED : September 10, 1996
INVENTOR(S) : Hering-Der Chiou et al It is certified that error appears in the above-indentified patent and that said Letters Patent is hereby corrected as shown below:

Claim 6, column 6, line 7, remove "." and replace with

--above the melt and providing a flow to mix the second dopant with the melt.--

Signed and Sealed this

Seventeenth Day of December, 1996

*Attest:*

BRUCE LEHMAN

*Attesting Officer*  *Commissioner of Patents and Trademarks*